(12) United States Patent
Nguyen et al.

(10) Patent No.: US 6,785,184 B2
(45) Date of Patent: Aug. 31, 2004

(54) SELF-TIMED ACTIVATION LOGIC FOR MEMORY

(75) Inventors: Thu V. Nguyen, Saratoga, CA (US); Ruban Kanapathippillai, Dublin, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/423,168

(22) Filed: Apr. 25, 2003

(65) Prior Publication Data

US 2003/0202399 A1 Oct. 30, 2003

Related U.S. Application Data

(63) Continuation of application No. 10/047,538, filed on Jan. 14, 2002, now Pat. No. 6,618,313.
(60) Provisional application No. 60/271,282, filed on Feb. 23, 2001.

(51) Int. Cl.[7] .................................................. G11C 7/00
(52) U.S. Cl. ......................... 365/227; 365/194; 365/233
(58) Field of Search ................................ 365/233, 194, 365/226, 189.08

(56) References Cited

U.S. PATENT DOCUMENTS 6,618,313 B2 * 9/2003 Nguyen et al. ............. 365/227

* cited by examiner

Primary Examiner—Thong Q. Le
(74) Attorney, Agent, or Firm—Glen B. Choi

(57) ABSTRACT

A self timed logic circuit is used to generate a self timed memory clock to access data in a memory. The self timed memory clock has a periodic pulse which enables circuitry in the memory for a brief period of time over its pulse width. The amount of charge and voltage change, required on bit lines for resolving a bit of data stored in a memory cell during the pulse width of the self timed memory clock, is reduced by using a sensitive sense amplifier so that power can be conserved.

16 Claims, 4 Drawing Sheets

SELF-TIMED ACTIVATION LOGIC FOR MEMORY

CROSS REFERENCE TO RELATED APPLICATIONS

The present patent application is a Continuation of prior application Ser. No. 10/047,538, filed Jan. 14, 2002, now U.S. Pat. No. 6,618,313 entitled SELF-TIMED ACTIVATION LOGIC FOR MEMORY. This non-provisional U.S. patent application claims the benefit of U.S. Provisional Application No. 60/271,282 filed on Feb. 23, 2001 by inventors Thu V. Nguyen et al entitled "SELF-TIMED ACTIVATION LOGIC FOR MEMORY".

FIELD OF THE INVENTION

The invention relates generally to the field of memory. Particularly, the invention relates to clock timing for accessing memory locations.

BACKGROUND OF THE INVENTION

Memory integrated circuit devices are well known. Memory cells can be read only (ROM), randomly accessible (RAM), static (SRAM), semi-static, dynamic (DRAM), programmable (PROM, EPROM, EEPROM), volatile, non-volatile (NVRAM) or of another memory type. The technology of transistor circuits used to form the memory cells can be varied as well. Exemplary types of technologies used include NMOS, PMOS, CMOS, bipolar, bi-CMOS or another circuit or technology type.

Typically, the memory cells are arranged in an array or matrix of memory cells and are accessed using column and row address decoders. The row address decoder typically generates a signal on a word line to select a desired row of memory cells. The column decoder then selects desired bit lines for certain memory cells in the row. Depending upon whether a write or read operation is desired, data is written into the selected memory cells or read out of the selected memory cells respectively. In either case, parasitic capacitance on the bit lines requires that charges be removed or stored thereon.

Memory is oftentimes used to store data or operands upon which operations are performed over and over to obtain results. Access to a memory that stores the data or operands is very frequent, particularly in digital signal processing applications where the data may be digital data samples representing the communication over a communications channel. Because operands are frequently used, there are frequent accesses to the memory that stores them. A high rate of access into a memory tends to consume larger amounts of power than a memory than is infrequently accessed. This is due in part to the more frequent charging and discharging of charges stored on parasitic capacitances in the memory. The equation for computing power dissipated by a capacitor is $$P = \frac{1}{2} CV^2 F.$$

It is desirable to lower power consumption over that of the prior art.

BRIEF DESCRIPTION OF THE DRAWINGS

The features and advantages of the invention will become apparent from the following detailed description in which.

Like reference numbers and designations in the drawings indicate like elements providing similar functionality.

DETAILED DESCRIPTION OF THE INVENTION

In the following detailed description of the invention, numerous specific details are set forth in order to provide a thorough understanding of the invention. However, the invention may be practiced without these specific details. In other instances well known methods, procedures, components, and circuits have not been described in detail so as not to unnecessarily obscure aspects of the invention.

Another reason for power dissipation in a capacitor is the change in voltage V from the addition or removal of charges from the capacitor. If the change in voltage V on the capacitors in a memory array can be reduced, the power consumption can be lowered. A self timed logic circuit is used to generate a self timed memory clock to access data in a memory. The self timed memory clock has a periodic pulse which enables circuitry in the memory for a brief period of time over its pulse width. The amount of charge and voltage change, required on bit lines for resolving a bit of data stored in a memory cell during the pulse width of the self timed memory clock, is reduced by using a sensitive sense amplifier so that power can be conserved.

Figure 1:
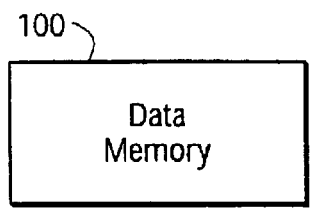
FIG. 1 is a block diagram of a memory including an embodiment of the invention.

Referring now to FIG. 1, a memory 100 is illustrated which may be utilized within a digital signal processing (DSP) integrated circuit. In a DSP, accessing data within memory is a frequent occurrence. Memory within a digital signal processor is often used to store data samples and coefficients of digital filters and may oftentimes referred to as data memory.

Figure 2:
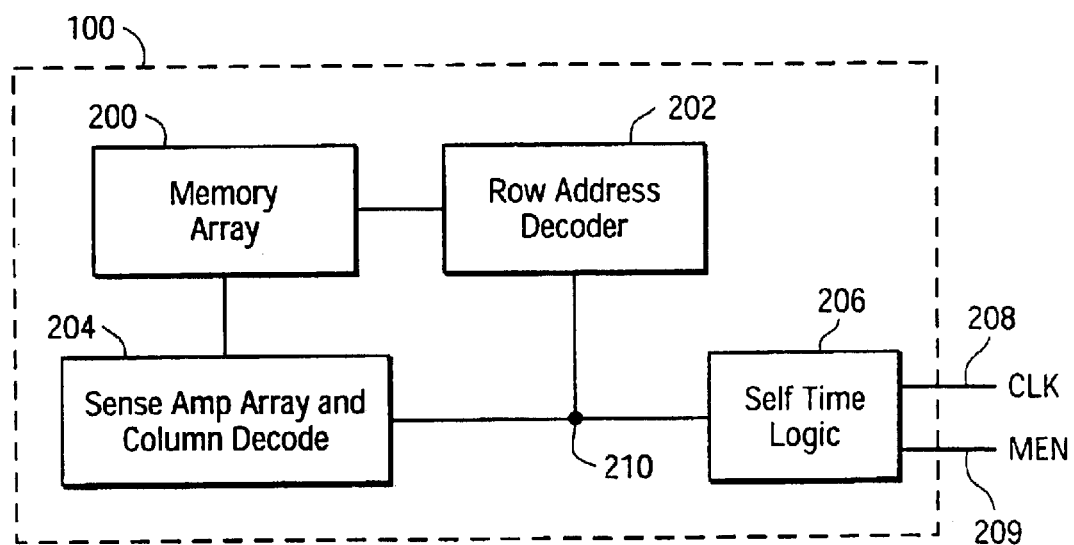
FIG. 2 is a detailed functional block diagram the memory of FIG. 1 including an embodiment of the invention.

Referring now to FIG. 2, a functional block diagram of the memory 100 is illustrated. The memory 100 includes the memory array 200, a row address decoder 202, a sense amp array and column decoder 204, and a self-time logic block 206. The memory array 200 consists of memory cells organized in rows and columns. The memory cells may be dynamic memory cells, static memory cells or non-volatile programmable memory cells. The row address decoder 202 generates a signal on one of the word lines in order to address a row of memory cells in the memory array 200. The column decoder within the sense amp array and column decoder 204 selects which columns within the row of memory cells are to be accessed. The sense amplifiers within the sense amp array of the sense amp array and column decoder 204 determine whether a logical one or zero has been stored within the accessed memory cells during a read operation.

The self-time logic 206 of the memory 100 receives a clock input signal CLK 208 and a memory enable input signal MEN 209. The memory enable signal MEN 209 functions similar to a chip select signal by enabling and disabling access to the memory array 200. The self-time logic 206 gates the clock input signal CLK 208 with the memory enable signal MEN 209 to control access to the memory array 200. The self-time logic 206 generates a self-timed memory clock signal ST MEM CLK 210 which is coupled into the row address decoder 202 and the sense amp array and column decoder 204.

The self-timed memory clock signal ST MEM CLK 210 is coupled into the row address decoder 202 in order to appropriately time the selection of a row of memory cells. Additionally, the self-timed memory clock signal ST MEM CLK 210 generated by self-time logic 206 can appropriately time enable of the sense amp array during read accesses of the data memory and an array of tristate drivers (not shown) to drive the bit lines during write accesses. With appropriate timing of the self timed memory clock signal ST MEM CLK 210, the instantaneous power consumption can be reduced as well as the average power consumption over frequent accesses into the memory 100.

Figure 3:
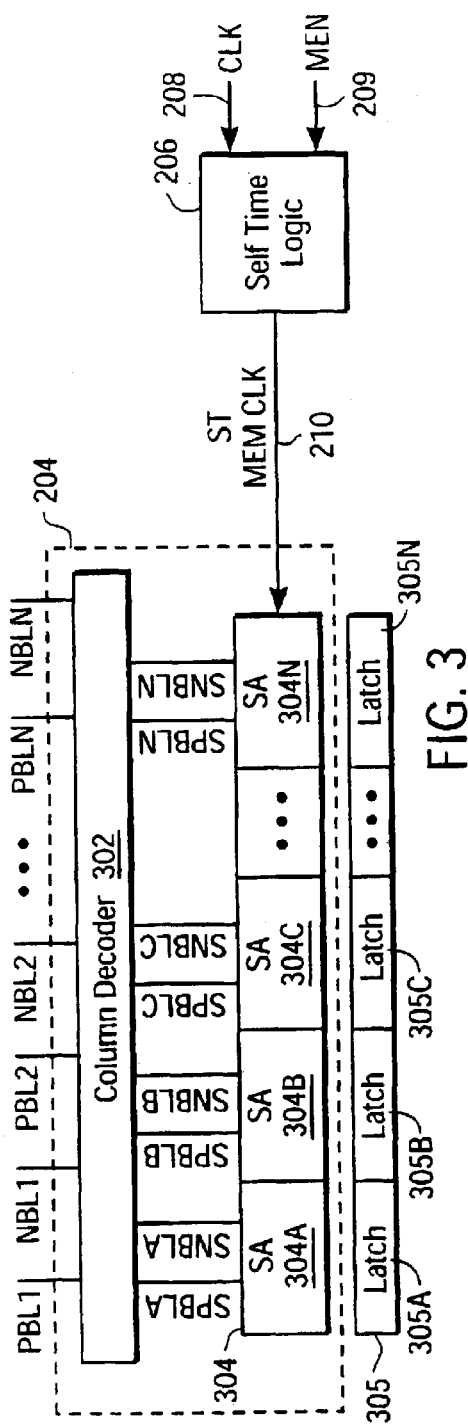
FIG. 3 is a detailed functional block diagram of the sense amplifier array and column decoder for an embodiment of the invention.

Referring now to FIG. 3, a functional block diagram of the sense amp array and column decoder 204 is illustrated coupled to the self-time logic 206. As discussed previously, the self-time logic 206 generates the self-timed memory clock signal ST MEM CLK 210. The self-timed memory clock signal ST MEM CLK 210 is coupled into the sense amp array and column decoder 204. The sense amp array and column array and column decoder 204 includes a column decoder 302 and N sense amplifiers SA 304A–304N. The self-timed memory clock signal ST MEM CLK 210 is coupled into each of the sense amplifiers SA 304A–304N.

The column decoder 302 couples to positive bit lines (PBL1–PBLN) and negative bit lines (NBL1–NBLN) of each of the columns of memory cells within the memory array 200. In FIG. 3, the columns of bit lines for the memory cells are labeled PBL1 through PBLN for the positive bit lines and NBL1 through NBLN for the negative bit lines. In one embodiment, positive bit lines (PBL1–PBLN) and negative bit lines (NBL1–NBLN) of each of the columns of memory cells within the memory array 200 are precharged high. The column decoder 302 selects the positive and negative bit lines which are to be multiplexed into the array of sense amplifiers SA 304A–304N. The selected positive bit lines (PBL1–PBLN) and negative bit lines (NBL1–NBLN) of the memory array are multiplexed into the sense amplifiers over the signal lines labeled SPBLA through SPBLM for positive bit lines and SNBLA through SNBLM for negative bit lines. In one embodiment, each of the sense amplifiers SA 304A–304N receives signals from a respective pair of bit lines, a positive bit line SPBLi (i.e. one of SPBLA–SPBLM) and a negative bit line SNBLi (i.e. one of SNBLA–SNBLM). The output from each of the sense amplifiers SA 304A–304N is coupled into a latch 305A–305N in an array of latches 305 to store data.

Figure 4:
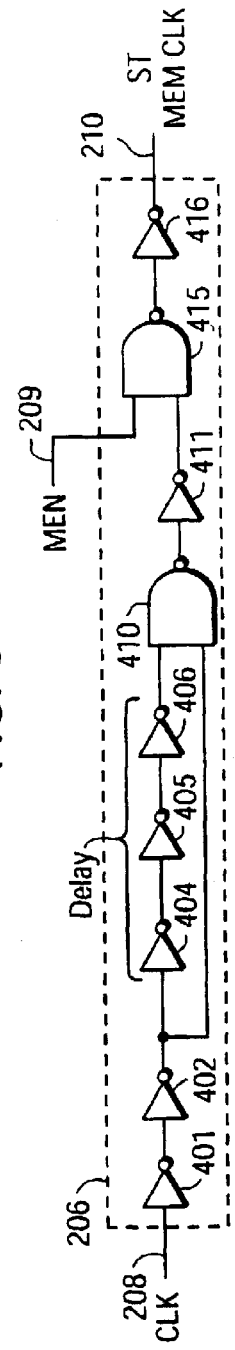
FIG. 4 is a detailed functional block diagram of the self time logic for an embodiment of the invention.

Referring now to FIG. 4, a functional block diagram of the self-time logic 206 is illustrated. The self-time logic 206 includes a pair of inverters 401 and 402, an odd number of inverters 404–406, a first NAND gate 410, an inverter 411, a second NAND gate 415, and an inverter/buffer 416 coupled together as illustrated in FIG. 4. The first inverter 401 receives the clock input 208. The first NAND gate 415 receives the memory enable input signal MEN 209. The inverter/buffer 416 receives the output of the NAND gate 415 in order to generate the self-timed memory clock ST MEM CLK 210 as the output from the self timed logic 206. The odd number of inverters 404–406 generates a delay that allows for the generation of the self-timed memory clock ST MEM CLK 210. The odd number for the odd number of inverters 404–406 can be made selectable in that a pair of inverters can be deleted or added in order to vary the pulse width of the pulses in the self-timed memory clock signal ST MEM CLK 210. The selection of the number of inverters can be controlled by control logic, fuse link methods or laser trim methods.

Figure 5:
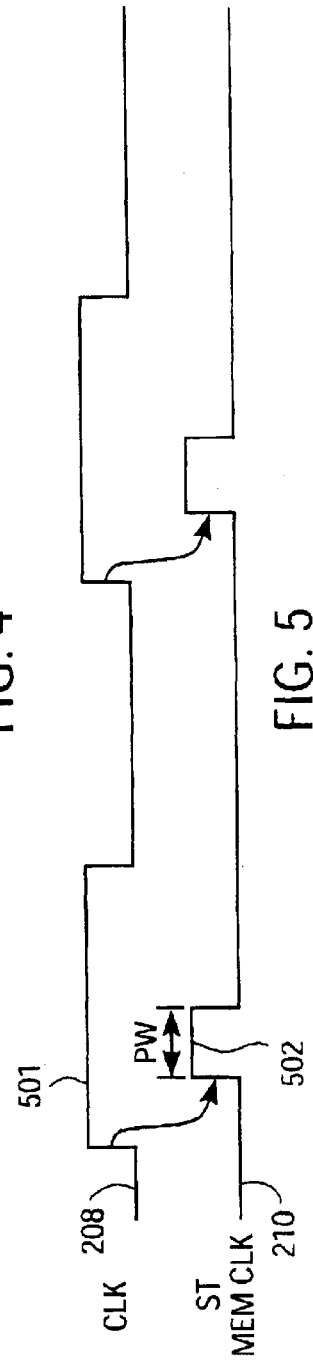
FIG. 5 is a waveform diagram illustrating the self timed memory clock generated by the self time logic of FIG. 4.

Referring now to FIG. 5, wave forms for the clock input signal 208 in the self-timed memory clock signal ST MEM CLK 210 which is generated by the self-time logic 206 are illustrated. FIG. 5 depicts the wave form of the self-timed memory clock ST MEM CLK 210 under the presumption that the memory-enabled signal 209 has been enabled. If the memory-enabled signal 209 is not enabled but disabled, the self-timed memory clock pulse is not generated.

When the clock input signal 208 has a positive going pulse such as pulse 501, its rising edge generates a pulse in the self-timed memory clock signal ST MEM CLK 210. The pulse width of each of the pulses in the self-timed memory clock ST MEM CLK 210 are a function of the signal delay through the odd numbered inverters 404–406. The greater the delay provided by the odd inverters 404–406, the larger is the pulse width of pulses 502 in the self-timed memory clock signal ST MEM CLK 210. The odd number of inverters in the odd inverters 404–406 is shown in FIG. 4 but can also be 1, 5, 7, 9 or more odd number of inverters. The NAND gate 410 generates a momentary pulse due to a difference between the timing of the non-delayed input into the NAND gate 410 and the odd inverters 404–406 and the timing of the delayed input into the NAND gate from the output of the odd inverters 404–406. The momentary pulse is periodically generated as pulses 502 in the self-timed memory clock signal ST MEM CLK 210. Because the delay circuitry (inverters 404–406) and the NAND gate 410 are somewhat matched, the pulse width PW of the pulses 502 scale with temperature, voltage, and process changes. That is, with faster transistors due to process temperature or voltage of the power supply, a narrower pulse width is only needed to resolve a memory access. With slower transistors due to process temperature or voltage of the power supply, a longer pulse width is provided to resolve a memory access.

Figure 6A:
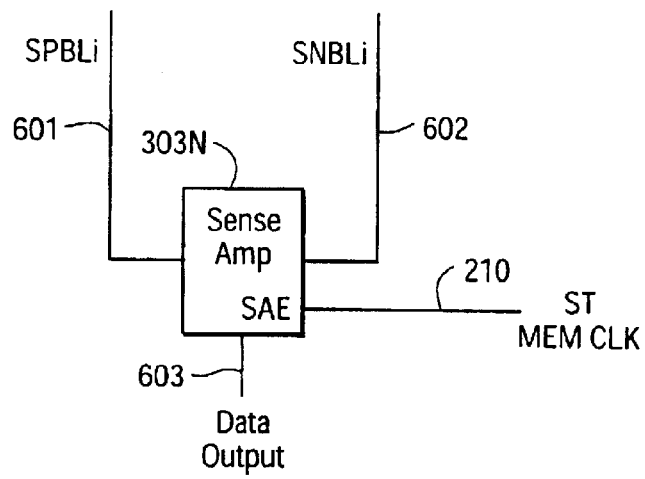
FIG. 6A is a block diagram of a sense amplifier of the sense amplifier array.

Referring now to FIG. 6A, a block diagram of a sense amplifier 304N is illustrated. The sense amp 304N receives a positive bit line SPBLi 601 and a negative bit line SNBLi 602 as its data inputs to generate a data output 603. The sense amp receives the self-timed memory clock signal ST MEM CLK 210 at its sense amp enable input SAE. When enabled by pulses of the self-time memory clock ST MEM CLK210, the sense amp 304N attempts to make a determination between a signal on the positive bit line SPBLi 601 and the negative bit line SNBLi 602. The sense amp 304N looks for a differential between voltage levels on each of these bit lines 601 and 602. For a power supply voltage supply of approximately 1.8 volts, the sense amp can resolve a differential of 160 mv between the bit lines to generate the data output signal 603 in one embodiment. This amounts to approximately 10% of the power supply voltage level of 1.8 volts. The sense amp 304N generates a logical one (high level) or a logical zero (low level) on the data output 603 after resolving a voltage change on a bit line. After a read access to the memory, the output from the sense amp 304N is latched and the sense amp 304N is disabled.

Figure 6B:
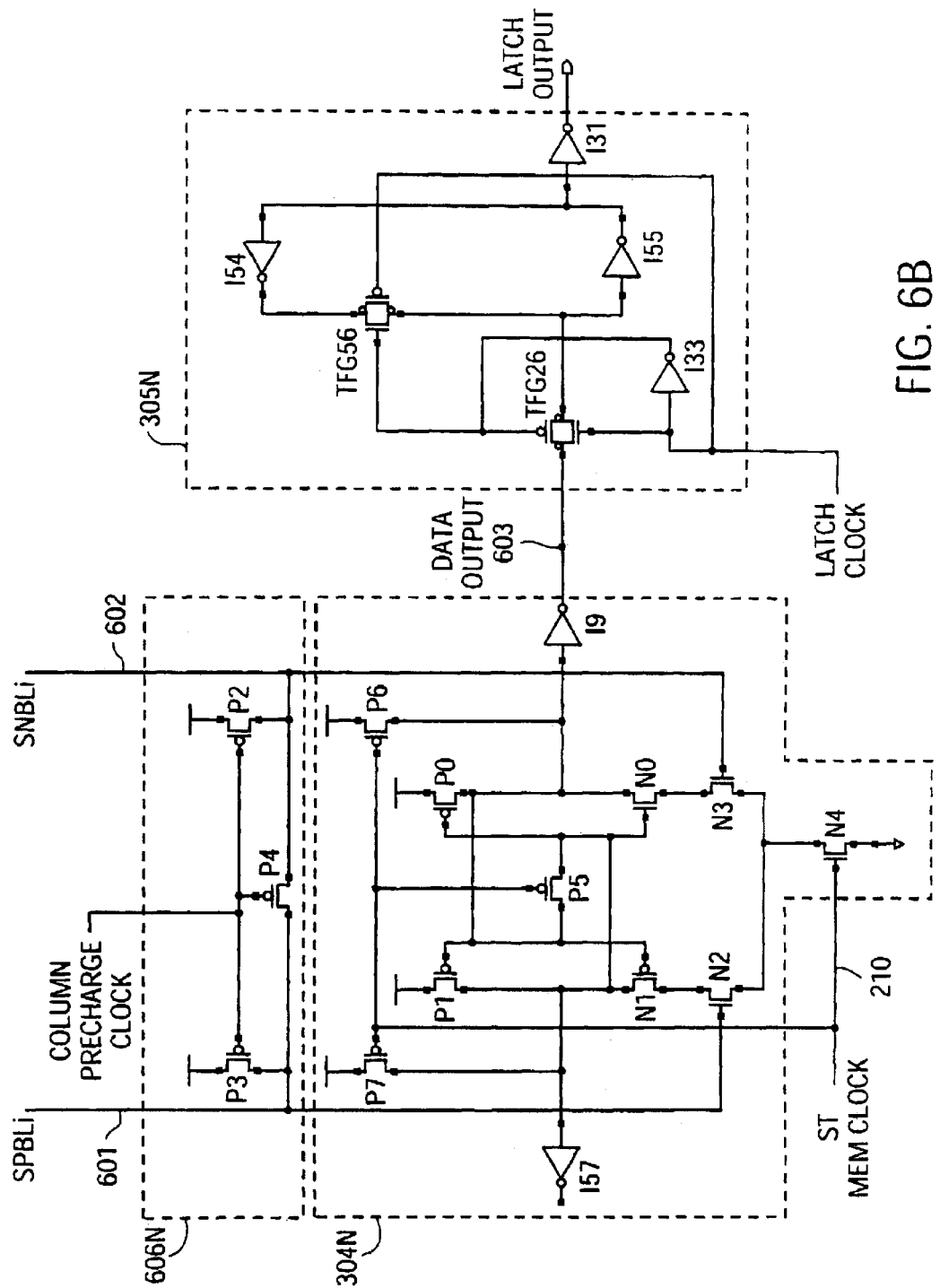
FIG. 6B is a schematic diagram of a sense amplifier of the sense amplifier array coupled to an output latch and pre-charge circuitry.

Referring now to FIG. 6B, a schematic diagram of one embodiment for the sense amplifier 304N of the sense amplifier array coupled to an output latch 305N and precharge circuitry 606N is illustrated. The sense amplifier 304N includes transistors N0–N4, transistors P0, P1, P5, P6, and P7, and inverters 19 and 157 as shown and coupled together in FIG. 6B. The precharge circuitry 606N includes transistors P2–P4 as shown and coupled together in FIG. 6B. The latch 305N includes inverters I31, I33, I54, and I55 and transfer gates TFG 26 and TFG 56 as shown and coupled together in FIG. 6B. The transistors N0–N4 and P0–P7 each have a source, drain and gate.

In one embodiment, the transistors P2–P4 of the precharge circuitry 606N have the minimum possible size channel lengths with the widths of transistors P2–P3 each being two microns and the width of transistor P4 being one micron. The precharge circuitry 606N precharges and equalizes the charges on the positive bit line SPBLi 601 and the negative bit line SNBLi 602 prior to accessing a memory cell. The precharge circuitry 606N is enabled by a column precharge clock coupled to the gates of transistors P2, P3, and P4. When the column precharge clock is active (e.g. low), the transistors P2, P3 and P4 are turned ON to charge and equalize the charges and voltage level on the positive bit line SPBLi 601 and the negative bit line SNBLi 602. The column precharge clock is turned OFF prior to a memory cell being accessed.

Inverter 19 of the sense amplifier 304N buffers the load placed on the data output 603. The inverter I57, being the same size as inverter 19, provides equal capacitive loading to the opposite side of the sense amplifier 304N.

In one embodiment of the sense amplifier 304N, transistors N0–N4 are n-channel metal oxide semiconductor field effect transistors (NFETS) and P0, P1, P5, P6 and P7 are p-channel metal oxide semiconductor field effect transistors (PFETS) with channel lengths of the transistors N0–N4 and transistors P0, P1, P5, P6, and P7 are the minimum possible size channel lengths for n-type and p-type transistors respectively and the widths of transistors N0–N4 are each six microns while the widths of transistors P0–P1 are each two microns, the widths of transistors P6–P7 are each two and one-half microns, the width of transistor P5 is one-half micron.

The voltage level or charges on the positive bit line SPBLi 601 and the negative bit line SNBLi 602 are differentiated by the sense amplifier 304N when the self-timed memory clock ST MEM CLOCK 210 is asserted. The positive bit line SPBLi 601 and the negative bit line SNBLi 602 couple to the gates of the differential pair of transistors N2 and N3. The self-timed memory clock ST MEM CLOCK 210 couples to the gates of transistors N4, P5, P6 and P7 in order to enable the sense amplifier. When the self-timed memory clock ST MEM CLOCK 210 is not asserted (e.g. a low level), transistor N4 is OFF disabling the differential pair of transistors N2 and N3, transistors P7 and P6 each pre-charge each side of the sense amplifier and transistor P5 equalizes the charge and voltage level one each side prior to differentiation. When the self-timed memory clock ST MEM CLOCK 210 is asserted (e.g. a high level), transistors P5, P6, and P7 are OFF, transistor N4 is ON enabling the differential pair of transistors N2 and N3 to differentiate between the higher and lower charge and voltage level on the positive bit line SPBLi 601 and the negative bit line SNBLi 602. When the sense amp 304N is enabled, transistors N0, N1, P0 and P1 amplify the difference established by the differential pair of transistors N2 and N3 in order to generate an output logic level representing a bit read out from a memory cell. Inverter 19 inverts and buffers the output into the latch 305N.

The latch 305N is a conventional latch which is clocked by a latch clock. The latch clock is selectively enabled depending upon how may bits are to be read out of the memory 100. If only eight bits are to be read out of the memory 100, then only eight sense amplifiers 304N and eight latches 305N are enabled. If sixteen bits are to be read out of the memory 100, then only sixteen sense amplifiers 304N and sixteen latches 305N are enabled. If m bits are to be read out of the memory 100, then m sense amplifiers 304N and m latches 305N are enabled. The timing of the latch clock is similar to that of the self-timed memory clock ST MEM CLK 200 but with a slight delay. When the latch clock is asserted (e.g. a high logic level), the transfer gate TFG 26 is opened to sample the data output 603 from the sense amplifier 304N. When the latch clock is de-asserted (e.g. a low logic level), transfer gate TFG 26 is turned OFF (i.e. closed) and transfer gate TFG 56 is turned ON (i.e. opened) so that the cross-coupled inverters 154 and 155 store the data sampled on the data output 603 from the sense amplifier 304N.

Figure 7:
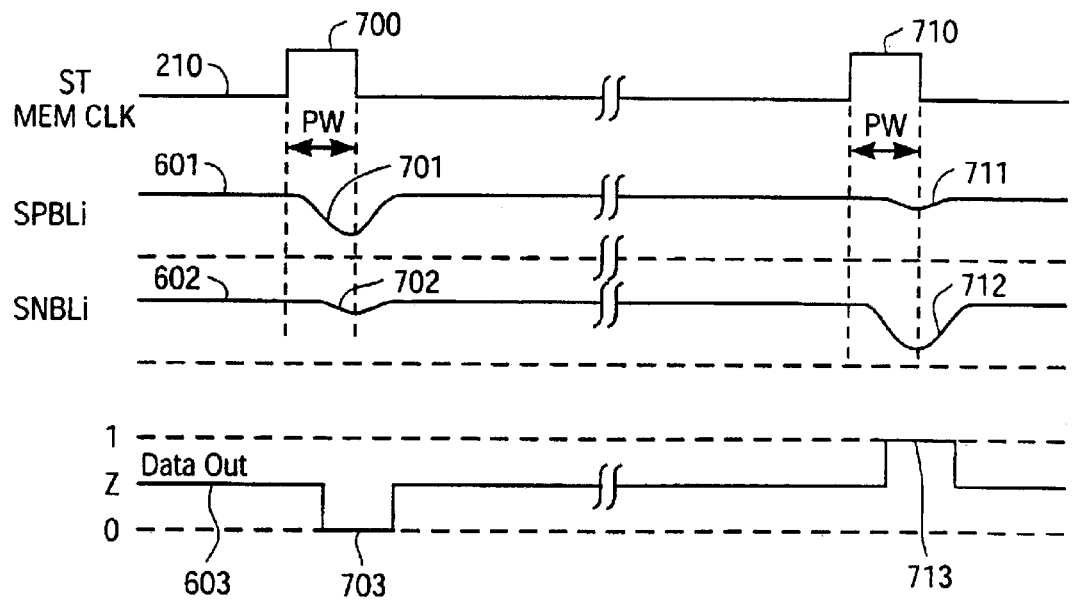
FIG. 7 is waveform diagrams illustrating the operation of the memory and sense amplifier using the self timed memory clock.

Referring now to FIG. 7, wave form diagrams of the functionality of the sense amplifier 304N are illustrated. The self-timed memory clock ST MEM CLK 210 has periodic pulses having a pulse width (PW) as illustrated by pulses 700 and 710 in FIG. 7. The circuitry of FIG. 4 provides a pulse width PW that is scaled with temperature, voltage, and process changes. That is, the pulse-width tracks changes in external temperature, power supply voltage, and manufacturing process variables.

In FIG. 7, the rising edge of each of the pulses 700 and 710 of the self-timed memory clock ST MEM CLK 210, first enable the row address decoder to select a word line for selection of memory cells in a row of the memory array 200. The rising edge of the pulses 700 and 710 of the self-timed memory clock ST MEM CLK 200 also enable the sense amplifier 304N to differentiate between the voltage levels on the positive bit line SPBLi 601 and the negative bit line SNBLi 602. As illustrated in FIG. 7, after the self-timed memory clock pulse 700 or 710 enable the row address decoder, at least one of the bit lines SPBLi 601 and SNBLi 602 experiences a change in voltage level to establish a voltage difference between them. The sense amplifier 304N differentiates the voltage levels on each bit line and generates the data output signal 603 as illustrated by the pulse 703 and the pulse 713.

In the case of the pulse 700 of the self-timed memory clock ST MEM CLK 210, the positive bit line SPBLi 601 goes low in comparison with the negative bit line SNBLi 602 as illustrated by the falling voltage level 701 in the positive bit line and the stable voltage level 702 in negative bit line. The sense amplifier 304N differentiates between the voltage levels 701 and 702 to generate a zero logic level 703 representing a logical one or logical zero level stored in the memory cell as the case may be.

For the pulse 710 of the self-timed memory clock ST MEM CLK 210, the negative bit line SNBLi 602 experiences a voltage drop as illustrated by the wave form at position 712 in comparison with the stability of positive bit line SPBLi 601 at position 711. The sense amplifier 304N differentiates between the voltage levels at points 711 and 712 on the wave forms respectively, in order to generate the logical one pulse 713 in wave form 603. This logical one pulse 713 represents a logical zero or one stored in the memory cell as the case may be.

Power consumption is proportional to the pulse width PW in the pulses of the self-timed memory clock ST MEM CLK 210. The narrower the pulse width needed to resolve a differential between the positive bit line SPBLi 601 and the negative bit line SNBLi 602, the greater is the power conservation. This is so because a change in voltage or charge on the positive bit line SPBLi 601 or the negative bit line SNBLi 602 can be less with a narrower pulse width for the pulses of the self-timed memory clock ST MEM CLK 210. The pulse width of the pulses in the self-timed memory clock ST MEM CLK 210 establishes a short time period for the sense amplifier 304N to evaluate a difference between the positive bit line SPBLi 601 and the negative bit line SNBLi 602. After the falling edge of pulses in the self-timed memory clock ST MEM CLK 210, the wordlines can be turned OFF so that the charges on positive bit lines (PBL1–PBLN) and negative bit lines (NBL1–NBLN) are not further changed by the memory cells so that power is conserved in the memory 100. After the self-timed memory clock ST MEM CLK 210 is turned OFF, the precharging of the positive bit lines (PBL1–PBLN) and negative bit lines (NBL1–NBLN) can occur. The pulse width of the self-timed memory clock ST MEM CLK 210 provides less change in charges on positive bit lines (PBL1–PBLN) and negative bit lines (NBL1–NBLN) during memory accesses so that less power is consumed when restoring charges during a precharging process.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method comprising:
   generating a self timed memory clock including periodic pulses;
   selectively enabling an array of sense amplifiers coupled to bit lines of a memory in response to a narrow pule width of the periodic pulses; and
   selectively determining a logical state of memory cells coupled to the bit lines in response to the narrow pulse width of the periodic pulses.

2. The method of claim 1, wherein to determine the logical state of a the memory cells, a differential voltage among bit lines changes at least approximately ten percent from a supplied power supply voltage level.

3. The method of claim 1, wherein to determine the logical state of the memory cells, a differential voltage among bit lines changes at least approximately fifteen percent from a supplied power supply voltage level.

4. The method of claim 1, wherein to determine the logical state of the memory cells, a differential voltage among bit lines changes between a range of approximately ten to approximately twenty five percent of a supplied power supply voltage level.

5. The method of claim 1, wherein a time to determine a logical state of the memory cells depends at least on the pulse width of the periodic pulses.

6. The method of claim 1, wherein power conservation during accessing of the memory cells depends at least on the pulse width of the periodic pulses.

7. An apparatus comprising:
   a delay to generate delayed inverted clock signal based on a clock input signal;
   a first NAND gate receive and NAND together the delayed inverted clock signal and the clock input signal and to generate an inverted first memory clock signal including a narrow periodic pulse;
   a first inverter to receive and invert the inverted first memory clock signal and to generate a second memory lock signal including a narrow periodic pulse;
   a second NAND gate to receive and NAND together the second memory clock signal and a memory enable signal, the second NAND gate to generate a third memory clock signal; and
   a second inverter to receive and invert the third memory clock signal to generate a fourth memory clock signal including a narrow pulse width.

8. The apparatus of claim 7, wherein the delay includes one or more inverters to generate the delayed inverted doe signal.

9. The apparatus of claim 7, wherein the delay includes three inverters coupled in series together to generate the delayed inverted clock signal.

10. The apparatus to claim 7, wherein the delay includes five inverters coupled in series together to generate the delayed inverted clock signal.

11. A memory comprising:
    a memory array including a plurality of memory cells arranged into rows and columns;
    a self timed logic circuit to generate a self timed memory clock signal including a narrow periodic pulse;
    a row address decoder coupled to receive the self timed memory clock signal, the row address decoder to selectively generate a word line signal to access a row of memory cells in response to the narrow periodic pulse of the self timed memory clock signal; and
    an array of sense amplifiers coupled to bit lines of the columns of memory cells in the memory array, the sense amplifiers to determine a logical level stored in the memory cells that are addressed by the row address decoder, each sense amplifier to receive the self timed memory clock signal to enable differentiation between a voltage levels on a negative bit line and a positive bit line, each sense amplifier to determine the logical level stored in the memory cells during the narrow periodic pulse.

12. The memory of claim 11 wherein the pulse width is proportional to power consumption during accessing of the memory cells.

13. The memory of claim 11 wherein the narrow periodic pulse of the self timed memory clock signal shortens a time for a word line to be selected to reduce the amount of charge on the bit lines that is dissipated by the memory cells and to reduce the amount of charge on the bit lines at is to be restored during precharging.

14. The memory of claim 11, wherein the narrow periodic pulse of the self timed memory clock signal provides a shortened time for each sense amplifier to differentiate between the voltage levels on the negative bit line and the positive bit line and to determine the logical level stored in the memory cells.

15. The memory of claim 11, wherein power consumption of the memory cells is proportional to a width of the narrow periodic pulse of the self timed memory clock signal.

16. The memory of claim 11, wherein a time to determine a logical level stored in the memory cells is proportional a width of the narrow periodic pulse of the self timed memory clock signal.

* * * * *

UNITED STATES PATENT AND TRADEMARK OFFICE
CERTIFICATE OF CORRECTION

PATENT NO.    : 6,785,184 B2
DATED         : August 31, 2004
INVENTOR(S)   : Nguyen et al.

It is certified that error appears in the above-identified patent and that said Letters Patent is hereby corrected as shown below:

Column 1,
Line 52, delete the second occurrence of "than" and insert -- that --.

Column 3,
Line 20, delete the first occurrence of "of".

Column 5,
Line 9, delete "19" and insert -- I9 --.
Line 9, delete "157" and insert -- I57 --.
Lines 31 and 33, delete "19" and insert -- I9 --.

Column 6,
Line 5, delete "19" and insert -- I9 --.
Line 24, delete "154" and insert -- I54 --.
Line 24, delete "155" and insert -- I55 --.

Column 7,
Line 41, "pule" and insert -- pulse --.
Line 47, delete the first occurrence of "a".

Column 8,
Line 1, after "gate", insert -- to --.
Line 17, delete "doe" and insert -- clock --.
Line 51, delete "at" and insert -- that --.
Line 63, after "proportional", insert -- to --.

Signed and Sealed this

Thirty-first Day of May, 2005

JON W. DUDAS
*Director of the United States Patent and Trademark Office*